(12) United States Patent
Rogge et al.

(10) Patent No.: US 10,366,868 B2
(45) Date of Patent: Jul. 30, 2019

(54) APPARATUS AND METHOD FOR APPLYING SURFACE COATINGS

(71) Applicant: Europlasma NV, Oudenaarde (BE)

(72) Inventors: Eva Rogge, Kruishoutem (BE); Filip Legein, Keerbergen (BE)

(73) Assignee: Europlasma NV, Oudenaarde (BE)

( * ) Notice: Subject to any disclaimer, the term of this patent is extended or adjusted under 35 U.S.C. 154(b) by 706 days.

(21) Appl. No.: 14/434,525

(22) PCT Filed: Oct. 9, 2013

(86) PCT No.: PCT/EP2013/071020
§ 371 (c)(1),
(2) Date: Apr. 9, 2015

(87) PCT Pub. No.: WO2014/056968
PCT Pub. Date: Apr. 17, 2014

(65) Prior Publication Data
US 2015/0255252 A1     Sep. 10, 2015

(30) Foreign Application Priority Data

Oct. 9, 2012  (GB) .................................. 1218054.3
Sep. 10, 2013  (GB) .................................. 1316113.8

(51) Int. Cl.
| | | |
|---|---|---|
| C23C 16/00 | (2006.01) | |
| C23F 1/00 | (2006.01) | |
| H01J 37/32 | (2006.01) | |
| C08F 2/52 | (2006.01) | |

(Continued)

(52) U.S. Cl.
CPC ............ *H01J 37/3277* (2013.01); *B05D 1/62* (2013.01); *C08F 2/52* (2013.01); *C23C 16/509* (2013.01); *C23C 16/545* (2013.01); *H01J 37/32082* (2013.01); *H01J 37/32091* (2013.01); *H01J 37/32403* (2013.01); *H01J 37/32532* (2013.01); *H01J 37/32568* (2013.01);

(Continued)

(58) Field of Classification Search
USPC ........................................ 118/718; 156/345.2
See application file for complete search history.

(56) References Cited

U.S. PATENT DOCUMENTS 4,282,077 A * 8/1981 Reavill ............. H01J 37/32082
156/345.45
4,331,526 A * 5/1982 Kuehnle ............... C23C 14/562
204/192.13

(Continued)

FOREIGN PATENT DOCUMENTS

| EP | 0298420 A2 | 1/1989 |
| WO | 2005021833 A2 | 3/2005 |
| WO | 2013034920 A2 | 3/2013 |

*Primary Examiner* — Rakesh K Dhingra
(74) *Attorney, Agent, or Firm* — James Creighton Wray; Meera P. Narasimhan

(57) ABSTRACT

The present invention provides a method for applying a surface coating on, for example, a sheet of fabric and further provides a plasma chamber (10) for coating a sheet of fabric, e.g. a textile material, with a polymer layer, the plasma chamber (10) comprising a plurality of electrode layers (RF, M) arranged successively within the plasma chamber, wherein at least two adjacent electrode layers are radiofrequency electrode layers (RF) or ground electrode layers (M), thereby providing a surface coating on both sides of a fabric sheet.

15 Claims, 9 Drawing Sheets

(51) Int. Cl.
   *C23C 16/54*      (2006.01)
   *C23C 16/509*     (2006.01)
   *B05D 1/00*       (2006.01)

(52) U.S. Cl.
   CPC .. *H01J 37/32724* (2013.01); *H01J 37/32752* (2013.01); *H01J 37/32761* (2013.01); *B01D 2239/0478* (2013.01); *H01J 2237/202* (2013.01); *H01J 2237/332* (2013.01)

(56) References Cited

U.S. PATENT DOCUMENTS

| | | | | |
|---|---|---|---|---|
| 4,389,970 A | * | 6/1983 | Edgerton | C23C 16/481 118/666 |
| 4,829,189 A | * | 5/1989 | Goto | B29C 59/14 118/50.1 |
| 5,160,592 A | * | 11/1992 | Spitsin | B01J 19/088 204/164 |
| 5,571,749 A | * | 11/1996 | Matsuda | C23C 16/46 118/718 |
| 2001/0029893 A1 | * | 10/2001 | Yajima | C23C 16/5096 118/723 E |
| 2003/0072891 A1 | * | 4/2003 | Murakami | B05D 1/62 427/569 |
| 2005/0017833 A1 | | 8/2005 | Goodwin | |
| 2006/0118242 A1 | | 6/2006 | Herbert | |
| 2007/0224348 A1 | * | 9/2007 | Dickey | C23C 16/45551 427/248.1 |
| 2009/0246943 A1 | * | 10/2009 | Imaeda | C23C 14/566 438/478 |

* cited by examiner

APPARATUS AND METHOD FOR APPLYING SURFACE COATINGS

This application claims the benefit of GB Application No. 1218054.3 filed Oct. 9, 2012, GB Application No. 1316113.8 filed Sep. 10, 2013, and PCT/EP2013/071020 filed Oct. 9, 2013, International Publication No. WO 2014/056968 A1, and the amended sheets from the IPRP, which are hereby incorporated by reference in their entirety as if fully set forth herein.

The present invention relates to apparatus and methods of using apparatus for applying surface coatings and is especially, but not exclusively, related to apparatus and methods for depositing protective polymer coatings onto fabrics.

The words fabric or fabrics as used in this application includes materials that are not woven as well as woven or knitted textiles, which may be manufactured into articles such as items of apparel for application in daily use, in industrial environments, in personal protective equipment (PPE), in sport and leisure environments and so on. Other articles into which fabrics may be manufactured as well are commodities, such as backpacks, umbrellas, tents, blinds, screens, canopies, tapestry, household textiles, sleeping bags etc. Fabrics are also utilised as filtration media articles for use, for example, in heating, ventilation or air conditioning (HVAC) systems or for use in exhaust filters, diesel filters, liquid filters, filtration media for medical applications and so on. Frequently, in HVAC applications, fabrics are not woven, knitted or otherwise formed into materials with a regular fibre structure or regular arrangement of the fibres. The methods and processes of this invention are applicable to all such fabrics.

It is known to coat fabrics with coatings, e.g. polymer coatings, for the purpose of protecting the fabric from wear such as that experienced during everyday use or during repeated wash cycles.

It is also known to coat sheets of fabric material using roll-to-roll systems. Prior art roll-to-roll systems typically comprise electrode arrangements such as those shown in FIGS. 2 and 3. In such arrangements, monomer is polymerised onto a single side of a sheet of fabric material which is guided between the electrode layers. Accordingly, in order to coat both sides of the sheet of fabric material it is necessary to remove the roll once a coating has been deposited on a first side of the sheet, flip the roll by 180 degrees and guide the sheet material between the electrode layers once again to coat the obverse (i.e. second side) of the sheet. As will be appreciated, this method involves a significant amount of processing time in order to coat each side of the fabric. Moreover, the method involves lost process time due to loading and unloading rolls into and out from the apparatus.

Prior art documents also describe the use of a carrier gas, e.g. an inert gas such as helium, nitrogen or argon, to produce the plasma gas. The carrier gas is often used in ratios that show the use of much more carrier gas than monomer gas, e.g. 10:1.

It is a non-exclusive aspect of the present invention to provide an apparatus and a method for increasing the coating quality and reducing the time needed for coating.

In a first aspect, the invention provides a plasma chamber for coating a sheet of fabric, e.g. a textile material, with a polymer layer, the plasma chamber comprising a plurality of electrode layers arranged successively within the plasma chamber, wherein at least two adjacent electrode layers are radiofrequency electrode layers (RF) or at least two adjacent electrode layers are ground electrode layers (M).

In another aspect of the present invention, there is provided a plasma chamber for coating a sheet of fabric, such as a textile material, with a polymer layer, the plasma chamber having a plurality of electrode layers each having a generally planar or plate like form arranged successively within the plasma chamber, wherein at least two adjacent electrode layers are radiofrequency electrode layers or ground electrode layers.

Preferably, the at least two adjacent electrode layers are radiofrequency electrode layers.

Preferably, the outer pair of electrode layers are ground electrode layers.

In another aspect of the present invention, there is provided a plasma chamber having at least two pairs of electrode layers, and wherein the outer pair of electrode layers are either ground electrode layers or radiofrequency electrode layers.

Preferably, the plasma chamber comprises a pair of radiofrequency electrode layers and a pair of ground electrode layers, e.g. having the arrangement M/RF/RF/M or RF/M/M/RF, where 'M' denotes a ground electrode, 'RF' denotes a radiofrequency electrode, and where '/' denotes the positions where the fabric passes between the electrode layers.

Preferably, the plasma chamber comprises further pairs of radiofrequency or ground electrode layers, e.g. having the arrangement RF/M/RF/RF/M/RF or M/RF/M/M/RF/M or M/RF/M/RF/RF/M/RF/M or RF/M/RF/M/M/RF/M/RF or RF/M/RF/M/RF/RF/M/RF/M/RF or M/RF/M/RF/M/M/RF/M/RF/M or RF/M/RF/M/RF/M/M/RF/M/RF/M/RF and so on.

In an alternative embodiment, the plasma chamber may comprise a first electrode set and a second electrode set, the first and second electrode sets being arranged either side of a passage for receiving a fabric.

Preferably, one or both of the first and second electrode sets comprise an inner electrode layer and a pair of outer electrode layers.

Preferably, the inner electrode layer is a radiofrequency electrode and the outer electrode layers are ground electrodes, e.g. having the arrangement M*RF*M/M*RF*M or M*RF*M/M*RF*M/M*RF*M and so on.

Alternatively, the inner electrode layer may be a ground electrode and the outer electrode layers may be radiofrequency electrodes, e.g. having the arrangement RF*M*RF/RF*M*RF or RF*M*RF/RF*M*RF/RF*M*RF and so on.

Preferably, the plasma chamber may include further electrode sets, for example third, fourth, fifth and sixth electrode sets and so on. For example when adding a third electrode set, e.g. M*RF*M/M*RF*M/M*RF*M, the fabric is coated on each side in two passes.

In all embodiments of the invention, where the electrode layer is of the radiofrequency type, the electrode layer may also include heat regulating means, e.g. a hollow portion such as a tube for receiving a heat regulator fluid.

Where the electrode layer is of the ground type, the electrode layer need not comprise a heat regulating means. Thus, electrode layers of this type may simply comprise a planar plate, mesh or other configuration suitable for generating plasma when arranged adjacent to a radiofrequency electrode layer.

The electrode layers are preferably of a planar or plate form. One advantage of such a configuration is that the generated plasma is substantially even across the surface of the electrode set. Consequently, the rate of polymerisation of monomer onto the substrate is the same at any given point on the substrate resulting in increased uniformity and so on.

Preferably, the heat regulating means comprises tubing which follows a path which curves upon itself by approximately 180° at regular intervals to provide an electrode that is substantially planar in dimension.

Preferably, the heat regulating means comprises a diameter of from approximately 2.5 to 100 mm, more preferably from approximately 5 to 50 mm, even more preferably from approximately 5 to 30 mm, say up to 25, 20 or 15 mm, for example 10 mm.

Preferably, the heat regulating means has a wall thickness of from approximately 0.1 to 10 mm, more preferably from approximately 0.25 to 5 mm, even more preferably from approximately 0.25 to 2.5 mm, say 1.5 mm.

Preferably, the distance between the heat regulating means before and after the curve is between 1 and 10 times the diameter of the heat regulating means, say around 3 to 8, for example 5 times the diameter of the heat regulating means.

Preferably, the heat regulating means comprises a conductive material such as a metal, e.g. aluminium, stainless steel or copper. Other suitable conductive materials may be envisaged.

Preferably, the or each radiofrequency electrode generates a high frequency electric field at frequencies of from 20 kHz to 2.45 GHz, more preferably of from 40 kHz to 13.56 MHz, with 13.56 MHz being preferred.

Preferably, the plasma chamber further comprises locating and/or securing means such as one or more connecting plates and/or the chamber walls for locating each electrode or each electrode set at a desired location with the plasma chamber.

Preferably, the locating and/or securing means is removable from the plasma chamber, e.g. the locating and/or securing means is slidably removable from the plasma chamber.

Preferably, the plasma chamber comprises one or more inlets for introducing a monomer to the plasma chamber.

Preferably, each inlet feeds monomer into a monomer distribution system that distributes the monomer evenly across the chamber. For example, the monomer inlet may feed into a manifold which feeds the chamber.

Preferably the evaporated monomer is able to strike the plasma and thereby substantially obviates the need to use an inert gas, such as helium, nitrogen or argon, as a carrier gas.

However, Applicant found that in some cases the addition of a small amount of carrier gas leads to better stability of the plasma inside the plasma chamber, thereby providing a more uniform thickness of the coating layer. The ratio of carrier gas to monomer is preferably equal to or less than 1:4.

Preferably the carrier gas is an inert gas such as helium or argon.

Preferably the carrier gas and the monomer are mixed together before entering the process chamber, to provide an improved mixture of the carrier gas and the monomer prior to processing.

The apparatus also includes a monomer vapour supply system. Monomer is vaporized in a controlled fashion. Controlled quantities of this vapour are fed into the plasma chamber preferably through a temperature controlled supply line.

Preferably, the monomer is vaporized at a temperature in the range of 50° C. to 180° C., more preferably in the range of 100° C. to 150° C., the optimum temperature being dependent on the physical characteristics of the monomer. At least part of the supply line may be temperature controlled according to a ramped (either upwards or downwards) temperature profile. The temperature profile will typically have a low end which is at a higher temperature than the point where the monomer is vaporized towards the end of the supply line. In the vacuum chamber the monomer will expand and the required temperatures to prevent condensation in the vacuum chamber and downstream to the pump will typically be much lower than the temperatures of the supply line.

In those situations where small amounts of carrier gas are used, the carrier gas can be delivered from a gas bottle, a tank or reservoir. Its flow rate is regulated by a mass flow controller. After passing the mass flow controller, the carrier gas is fed into the monomer supply line, with the monomer already having passed a flow controller in order to have established a stable monomer flow and a stable carrier gas flow.

It is preferable that a minimum distance of a few mm, more preferably 10 to 100 mm, for example 10 to 90 mm, say less than 80, 70, 60 or 50 mm, most preferably 15 to 50 mm, is maintained between the electrodes and the surface of the fabric to be coated.

Preferably, the plasma chamber also includes a plurality of rollers for guiding a sheet of fabric, in use, between each electrode layer.

Preferably, the rollers are heated to avoid the presence of cold spots where the monomer could condense. Preferably the rollers are heated from room temperature of approximately 20° C. to 85° C., more preferably from 25 to 70° C., for example 30 to 60° C. Preferably the rollers are heated by water, oil or other liquids or combinations thereof, most preferably water. Preferably the rollers are provided with a temperature control means to regulate the temperature to avoid significant temperature differentials.

Preferably the rollers can be divided in two categories: load cells and normal rollers. For rigid textile materials, such as thick films or foils, the rollers do not need to be driven individually. It is sufficient for the winding up roller to be driven at a certain speed, and all other rollers will start rolling because of the winding up movement.

For more fragile materials, such as apparel textile and filtration materials, most or all rollers are driven individually to avoid damage of the fabric or material or a rupture of the sheet of textile material due to excessive tensions. Preferably, for the most fragile materials, e.g. membranes or thin open structured nonwovens, the rollers are all driven individually or as a group and can be fine-tuned individually or as a group e.g. to optimise the processing of fragile textile materials.

Preferably the plasma chamber has one or more load cells that can be calibrated once a predetermined low base pressure is reached and prior to the first processing step and before any unwinding or winding of the fabric on the rolls, e.g. prior to outgassing, or prior to the gas inlet and prior to turning on the electromagnetic field for a pre-treatment, or prior to the gas inlet and prior to turning on the electromagnetic field for the coating step, whichever comes first.

The load cells are not driven but provide a certain tension on the sheet of fabric to be coated. The tension needs to be selected according to the material type.

For more fragile materials, and certainly for the most fragile materials, the applicant found that for each individual coating run after closing the machine and pumping down to base pressure, a calibration of all load cells improves the winding and coating quality.

Preferably prior to each individual coating run, the load cells are calibrated once the base pressure is reached and prior to the first processing step.

Preferably, during the coating process, the system runs at a speed of 0.1 m/min up to 20 m/min, for example 0.5 m/min to 15 m/min, such as 1 m/min to 10 m/min, say less than 9, 8, 7, 6 m/min, most preferably 1 to 5 m/min.

Preferably, the tension at which the fabric is wound is 0.2 to 250 kg (2 to 2500 N), more preferably 0.5 to 100 kg (5 to 1000 N), for example 1 to 50 kg (10 to 500 N), such as 1.5 to 25 kg (15 to 250 N), such as 1.5 to 10 kg (15 to 100 N).

Preferably, for rolls with limited outer diameter, weight and width, the unwinding zone and the winding up zone are positioned at the same side of the plasma chamber, wherein the unwinding starts in the lower part of the winding zone and the winding up takes place in the upper part.

Preferably, for rolls that are heavy, and/or have a large outer diameter and/or that are wide, e.g. 2 m wide, the unwinding and winding up take place at different sides of the plasma chamber, e.g. the unwinding at the left side and the winding up at the right side.

In a further aspect, the invention provides a method for coating a sheet of fabric, e.g. a textile material, with a polymer layer, the method comprising the steps of providing a plasma chamber having a plurality of electrode layers arranged successively within the plasma chamber, wherein at least two adjacent electrode layers are radiofrequency electrode layers or at least two adjacent electrode layers are ground electrode layers; and guiding a sheet of fabric between said electrode layers.

Preferably, the method includes the step of regulating the temperature of each radiofrequency electrode layer, e.g. from approximately 5 to 200° C.

Preferably, the method includes the step of regulating the temperature of each radiofrequency electrode layer from approximately 20 to 90° C., more preferably from approximately 25 to 60° C., even more preferably from approximately 30 to 40° C.

Preferably, the step of regulating the temperature of each radiofrequency electrode layer comprises feeding a heat regulating means with a fluid such as a liquid such as water, oil or other liquids or combinations thereof.

Preferably, the method includes the step of controlling the temperature of the plasma chamber, e.g. to avoid temperature differentials within the chamber, and to avoid cold spots where the process gas can condense. For instance, the door, and some or each wall(s) of the plasma chamber may be provided with temperature control means.

Preferably, the temperature control means maintains the temperature from room temperature of approximately 20 to 70° C., more preferably from between 30 and 50° C.

Preferably, also the pump, the liquid monomer supply and all connections between those items and the plasma chamber are temperature controlled as well to avoid cold spots where the process gas or gases can condense.

Preferably, the method comprises the step of applying power across the radiofrequency electrodes via one or more connecting plates.

The power for the plasma may be applied in either low power continuous wave mode or pulsed wave mode.

Preferably, when applied in continuous wave mode in a 9000 l chamber, the applied power is approximately 5 to 5000 W, more preferably approximately 10 to 4000 W, even more preferably approximately, say 25 to 3500 W, even further preferably, for example 30 to 3000 W, preferably still, for example 40 to 2500 W, and even further preferably from 50 to 2000, 1900, 1800, 1750, 1700, 1600, 1500, 1400, 1300, 1250, 1200, 1100, 1000, 950, 900, 850, 800, 750, 700, 650, 600, 550, 500, 450, 400, 350, 300, 250, 200, 175, 150, 125, 100, 90, 80, 75, 70 or 60 W.

Preferably, when applied in pulsed wave mode in a 9000 l chamber, the applied power is approximately 5 to 5000 W, more preferably approximately 25 to 4000 W, even more preferably approximately 50 to 3500 W, preferably, for example 75 to 3000 W, preferably still for example 100 to 2500 W, and even further preferably from 150 to 2000, 1900, 1800, 1750, 1700, 1600, 1500, 1400, 1300, 1250, 1200, 1100, 1000, 950, 900, 850, 800, 750, 700, 650, 600, 550, 500, 450, 400, 350, 300, 250, 200 or 175 W.

When applied in pulsed power mode, the pulse repetition frequency may be from 100 Hz to 10 kHz having a duty cycle from approximately 0.05 to 50%, with the optimum parameters being dependent on the monomer used.

Although the preferred applied power may appear to be high in comparison to conventional systems, those skilled in the art will understand that a large plasma chamber, such as one of 9000 liter capacity, will include more and larger radiofrequency electrodes compared to machines in which small sheets of textile are coated instead of rolls. As a consequence the power is increased to form a uniform and stable plasma. But, compared to prior art gaseous precursor monomers, the inventive coating is deposited at low power. Prior art coatings deposited using gaseous precursors require an applied power of 5000 W or more, up to 10000 W and even up to 15000 W, depending on the dimensions and the number of electrodes.

Preferably, the radiofrequency electrode or electrodes generate a high frequency electric field at frequencies of from 20 kHz to 2.45 GHz, more preferably of from 40 kHz to 13.56 MHz, with 13.56 MHz being preferred.

Preferably, the step of guiding a sheet of fabric between said electrode layers involves the use of a plurality of rollers.

As used herein, the term "adjacent electrode layers" is intended to refer to a pair of electrode layers, whereby one of the pair is disposed, in use, on one side of a sheet of fabric and the other of the pair is disposed on the obverse side of the sheet of fabric.

A further aspect of the present invention provides a method of coating a fabric, e.g. a textile material, with a polymer coating, which method comprises subjecting a monomer to a low power plasma polymerisation technique, wherein the monomer comprises the general formula (I):

$$C_nF_{2n+1}C_mX_{2m}CR_1Y\text{—OCO—}C(R_2)\text{=}CH_2 \qquad (I)$$

wherein n is 2 to 6, m is 0 to 9, X and Y are H, F, Cl, Br or I, $R_1$ is H or alkyl or a substituted alkyl, e.g. an at least partially halo-substituted alkyl, and $R_2$ is H or alkyl or a substituted alkyl, e.g. an at least partially halo-substituted alkyl.

Preferably, the method includes the step of coating the fabric as the fabric is passed by unwinding from a first roller on which the fabric is placed into the apparatus for coating it and being wound onto a second roller.

Preferably, the method includes the step of coating the fabric as the fabric is passed between a first roller and a second roller.

Preferably, the method includes the step of coating one or both surfaces of a sheet of fabric.

Before deposition of the coating, it might be advantageous to gas out (or out-gas) the textile and to apply an activation and/or cleaning step. By gassing out the textile, which is normally stored on a roll prior to coating, the base pressures that are achievable in a coating apparatus or plasma chamber are lower than without the gassing out (or outgassing), which leads to a better coating quality. The gassing out takes place during the pumping down by removing and pumping away all moisture present in or on the surface of the textile material. The time needed for gassing out depends on the type of polymers used to make the textile. For example, natural fibres, e.g. cotton, tend to have a higher rate of retention of water in comparison to synthetic fibres.

Preferably, the gassing out of the roll of textile is done as the textile is unwound, passed through the plasma zone and wound onto a second roller in a first processing step. Before starting the outgassing step, the plasma chamber containing the roll is pumped down to a certain predetermined low base pressure. Once this base pressure is reached, the outgassing starts by unwinding the textile from the roll without turning on the power source to avoid the presence of plasma in the chamber. As the pump is continuously pumping, moisture and trapped gases such as oxygen, nitrogen, carbon dioxide, noble gases and the like, are removed from the textile and away from the plasma chamber as the fabric is unwound from one roller and passes through the plasma zone without a plasma being present to be wound onto a second roller.

Depending upon the nature of the fabric, more complete outgassing can be achieved by repeating the process of unrolling the fabric and rolling it back onto a second roller. This may be repeated several times, particularly in the cases of natural fibres such as cotton or wool which tend to have a greater rate of absorption and retention of moisture than the synthetic fabrics.

When after the outgassing step the pressure inside the chamber is below a set base pressure for pre-treatment or below a set base pressure for coating, the next step, respectively the pre-treatment step or the coating step, can be initiated. If the set base pressure for pre-treatment or coating has not been reached, a second outgassing step can be executed by rewinding the textile from the second roller through the plasma zone to the first roller, while the pumping is continued and no plasma is generated inside the plasma zone.

If required, a third, fourth, fifth, sixth etc. outgassing step can be done in the same way as described above by winding the textile back and forth.

The main advantage of this unrolling and re-rolling method of gassing out is the fact that moisture and trapped gases are removed faster because when gassing out is done on a complete roll without unwinding but only by pumping down without unwinding, the moisture and trapped gases held or found in the layers of textile close to the core of the roll tend to need long pumping times to be removed compared to the times required if the textile is unrolled because, for example, in most cases the moisture in those inner layers of fabric on a complete roll is not sufficiently removed, even for very long pumping times.

Preferably, the gassing out step runs at a speed from 1 to 30 m/min, for example 2 to 20 m/min, such as 3 m/min to 15 m/min, most preferably at approximately 5 to 10 m/min.

Preferably, the speed at which the second, third, fourth, etc. outgassing step takes place is equal to or higher than the speed of the first outgassing step. Whether the speed is increased or not depends upon a variety of factors such as the composition of the fabric, (whether it includes natural fibres such as cotton of wool or is a synthetic fibre such as a polymer or polymers, the thickness, the construction, etc.).

Preferably the tension at which the fabric is wound is equal to the tension at which the coating takes place.

With this improved way of gassing out, a larger amount of moisture and trapped gases are removed and it is also done in a reduced time, which is beneficial for both coating quality and total processing time.

A pre-treatment step in the form of an activation and/or cleaning and/or etching step might be advantageous for improving the adhesion and cross-linking of the polymer coating.

Adhesion of the polymer coating to the fabric is essential for ensuring good and durable coatings capable of withstanding repeated washing of plasma coated textiles. In most cases, textiles contain residues as a result of manufacture processes used to make the textile, e.g. dyeing, weaving, warping, even yarn spinning. When such a textile is coated with a polymer, a substantial part of the polymer coating binds with these residues, and during washing a portion of the residue(s) is removed together with the coating. A pre-treatment in the form of an activation and/or cleaning and/or etching step removes these residues and prepares the textile for better binding of the polymer coating, thereby increasing the durability of the coated textile, e.g. during washing.

Preferably, this pre-treatment is done using inert gases, such as argon, nitrogen or helium, but also more reactive gases might be used, e.g. hydrogen and oxygen and/or etching reagents such as $CF_4$. The pre-treatment is performed with continuous wave plasma or pulsed wave plasma for short residence times in the plasma zone.

Preferably, the activation and/or cleaning and/or etching runs at a speed from 1 to 30 m/min, for example 2 to 20 m/min, such as 3 m/min to 15 m/min, most preferably at approximately 5 to 10 m/min.

Preferably the tension at which the fabric is wound is equal to the tension at which the coating takes place.

Preferably, when applied in continuous wave mode in a 9000 l chamber, the pre-treatment takes place at 25 to 10000 W, more preferably 50 to 9000 W, even more preferably at 100 to 8000 W, and further preferably 200 to 7500 W, and preferably still from 250 to 7000, 6750, 6500, 6250, 6000, 5750, 5550, 5250, 5000, 4750, 4500, 4250, 4000, 3750, 3500, 3250, 3000, 2900, 2800, 2750, 2700, 2600, 2500, 2400, 2300, 2250, 2200, 2100, 2000, 1900, 1800, 1750, 1700, 1600, 1500, 1400, 1300, 1250, 1200, 1100, 1000, 950, 900, 850, 800, 750, 700, 650, 600, 550, 500, 450, 400, 350 or 300 W.

Preferably, when applied in pulsed wave mode in a 9000 l chamber, the pre-treatment takes place at a peak power value of 25 to 10000 W, more preferably 50 to 9000 W, even more preferably at 100 to 8000 W, and further preferably 200 to 7500 W, and preferably still at 250 to 7000, 6750, 6500, 6250, 6000, 5750, 5550, 5250, 5000, 4750, 4500, 4250, 4000, 3750, 3500, 3250, 3000, 2900, 2800, 2750, 2700, 2600, 2500, 2400, 2300, 2250, 2200, 2100, 2000, 1900, 1800, 1750, 1700, 1600, 1500, 1400, 1300, 1250, 1200, 1100, 1000, 950, 900, 850, 800, 750, 700, 650, 600, 550, 500, 450, 400, 350, or 300 W.

It will be appreciated that the power and power mode at which the pre-treatment is performed depends on the gas or gas mixture used, and/or on the dimensions of the chamber and/or the design, size and/or number of electrodes present in the chamber.

In one embodiment, the total coating process comprises one single step, i.e. a coating step, whereby no gassing out and no pre-treatment is undertaken prior to coating the textile.

In another embodiment, the total coating process comprises three steps, each step including unwinding the textile, passing the textile through a plasma zone and winding up the textile, the steps including: a step for gassing out the textile; a pre-treatment step such as a plasma cleaning and/or activation and/or etching; and a coating step.

For the pre-treatment step, the winding up zone of the outgassing becomes the unwinding zone of the pre-treatment and the unwinding zone of the outgassing becomes the winding up zone of the pre-treatment. For the coating, the winding up zone of the pre-treatment becomes the unwinding zone of the coating and the unwinding zone of the pre-treatment becomes the winding up zone of the coating.

In a further embodiment, the total coating process comprises two steps, each step including unwinding the textile, passing it through the plasma zone and winding it up, the steps including: a step for combined gassing out and pre-treating (activating and/or cleaning and/or etching) the textile; and a coating step. For the combined gassing out and pre-treatment both processes take place at the same time.

For the coating step, the winding up zone of the first step becomes the unwinding zone of the coating step and the unwinding zone of the first step becomes the winding up zone of the coating.

Alternatively, the method may include the step of coating the fabric with a polymer coating whilst the fabric, e.g. an article of apparel, is fixedly positioned inside the plasma chamber.

Preferably, $R_1$ is H, $R_2$ is H, and Y is H.

Preferably, m is 1 to 9.

Preferred examples of the monomer include acrylates and methacrylates having perfluorocarbon backbones comprising two to six carbon atoms, such as 1H,1H,2H,2H-Perfluorooctyl methacrylate or 1H,1H,2H,2H-Perfluorooctyl acrylate.

Preferably, the method includes the step of utilising the monomer to strike the plasma to form the deposited polymer coating. Advantageously, there is no need to utilise an additional gas to strike the plasma.

Preferably, the method includes the step of applying a polymer coating having a thickness of from 10 to 500 nm, more preferably of from 10 to 250 nm, even more preferably of from 20 to 150 nm, e.g. most preferably of from 30 to 100 nm, 40 to 100 nm, 40 to 90 nm. The layer may be less than 500 nm, for example, less than 450, 400, 350, 300, 250, 200, 150, 100 nm.

Preferably, the method comprises applying a polymer coating having a uniformity variation of less than 10%.

Preferably, the method includes applying a polymer coating having a uniformity variation of the contact angles for water of less than 10° and a uniformity variation of the oil repellency of less than 0.5 according to ISO14419.

In the current invention, superhydrophobic surfaces can be created with contact angles for water of more than 100°, say 101, 102, 103, 104, 105, 106, 107, 108, 109, 110, 111, 112, 113, 114, 115, 116, 117, 118, 119 or 120°. The same coatings are superoleophobic with oil repellency levels above or above and including 3, 3.5, 4, 4.5, 5, 5.5, 6, 6.5, 7, 7.5 or 8, for example up to 6 according to ISO14419, say up to or up to and including 4, 4.5, 5, 5.5, 6, 6.5, 7, 7.5 or 8.

Preferably, the method includes the step of depositing a polymer coating having a contact angle for water of 100° or more and/or an oil repellency level of 3, 4 or more according to ISO14419 in a residence time in the plasma zone of approximately 2 minutes or less.

Preferably, the method includes the step of depositing a polymer layer having a thickness of approximately 30 nm in a residence time in the plasma zone of approximately 1 minute or less.

Preferably, the method includes the step of depositing a polymer layer having a thickness of approximately 50 nm in a residence time in the plasma zone of approximately 2 minutes or less.

The method may include drawing a fixed flow of monomer into a plasma chamber using a monomer vapour supply system. A throttle valve in between a pump and the plasma chamber may adapt the pumping volume to achieve the required process pressure inside the plasma chamber.

Preferably the throttle valve is closed by more than 90% (i.e. to reduce the effective cross section in the supply conduit to 10% of its maximum value) in order to reduce the flow through the chamber and to allow the monomer to become evenly distributed throughout the chamber.

Once the monomer vapour pressure has stabilized in the chamber the plasma is activated by switching on one or more radiofrequency electrodes.

Alternatively, the method may include introducing the monomer into the plasma chamber in a first flow direction; and switching the flow to a second direction after a predetermined time, for example from 10 to 300 seconds, for example from 30 to 240, 40 to 180 seconds, for example less than 180, 170, 160, 150, 140, 130, 120, 110, 100, 90, 80, 70, 60, 50, 40, 30 or 20 seconds to a second flow direction.

Preferably, further switching of the monomer flow direction may be executed, e.g. flow may be switched back to the first flow direction or to one or more further flow directions.

Preferably, monomer may enter the plasma chamber in the first flow direction for between 20 to 80% of a single process time or 30 to 70% of the time or 40 to 60% of the time or 50% of the time.

Preferably, the monomer may enter the plasma chamber in the second flow direction for between 20 to 80% of a single process time or 30 to 70% of the time or 40 to 60% of the time or 50% of the time.

Preferably, the first and second flow directions flow in substantially opposite directions. For instance, during a process, monomer may be introduced into the plasma chamber via walls or inlets which are substantially opposite to each another.

Advantages of the inventive method include, but are not limited to, one or more of allowing highly reactive classes of monomer to polymerise under low power continuous wave conditions; generating a benign plasma; adaptable design of the plasma zone and number of electrodes to optimize the process speed for improved implementation in production environments; providing a means for accurately controlling the temperature to avoid undesirable temperature gradients; adaptable tension on load cells and variable driving of the rollers for optimal winding of the material; adaptable design of the unwinding and winding up zone depending on the dimensions and weight of the roll of textile material to be coated.

Advantages of the inventive polymer coating include, but are not limited to, improved hydro- and oleophobic properties of the coated textile; improved functionality of the coated textile; improved adhesion; improved durability of the coated textile and maintained electrostatic charge in time and in case of contact with discharging liquids such as isopropanol for electrostatically charged filtration textiles, e.g. electrets.

A further aspect of the present invention provides a fabric, e.g. a textile material, having a polymer coating obtainable by contacting a fabric with a monomer and subjecting the monomer to low power plasma polymerisation, wherein the monomer comprises the general formula (I), and wherein n is 2 to 6, m is 0 to 9, X and Y are H, F, Cl, Br or I, $R_1$ is H or alkyl, e.g. —$CH_3$, or a substituted alkyl, e.g. an at least partially halo-substituted alkyl, and $R_2$ is H or alkyl, e.g. —$CH_3$ or a substituted alkyl, e.g. an at least partially halo-substituted alkyl.

Preferably, the fabric is a sheet of fabric, e.g. wound to a roll.

Preferably, the fabric is one of a woven, nonwoven, knitted, film, foil or membrane fabric.

Woven, nonwoven and knitted fabrics may have smooth surfaces or textured surfaces, in the cases of a pile weave or a pile knit for example.

Preferably the fabric comprises a synthetic material, a natural material or a blend.

Examples of materials include but are not limited to:

Synthetic: polypropylene (PP), polyethylene (PE), polyvinylchloride (PVC), polystyrene (PS), polyphenylene sulfide (PPS), polyacrylonitrile (PAN), polyurethane (PUR), polyurea, polytetrafluoroethylene (PTFE) and expanded polytetrafluoroethylene (ePTFE), polyester (PES)—such as polyethylene terephthalate (PET), recycled PET and polybutylene terephthalate (PBT), polyamide (PA)—such as PA6, PA66, and PA12, polyaramide, elastane (polyurethane-polyurea copolymer).

Natural and man-made: cotton, cellulose, cellulose acetate, silk, wool, etc.

Blends: cotton/PES 50:50, PES/carbon 99:1, recycled PES/elastane 92:8, etc.

Woven and knitted fabrics may have a thickness of from 50 μm to 5 mm. Nonwoven fabrics may have a thickness of from 5 μm to 5 mm. Film or foil fabrics may have a thickness of from 20 μm to 1 mm.

Preferably, the polymer coating has a thickness of from 10 to 500 nm, e.g. from 10 to 250 nm, e.g. from 30 to 100 nm, e.g. from 40 to 90 nm.

Preferably, the polymer coating comprises superhydrophobic and/or superoleophobic properties. Preferably, the superhydrophobic polymer coating has a contact angle for water of 100° or more, for example 101, 102, 103, 104, 105, 106, 107, 108, 109, 110, 111, 112, 113, 114, 115, 116, 117, 118, 119 or 120°. Preferably, the superoleophobic polymer coating comprises an oil repellency level above or above and including 3, 3.5, 4, 4.5, 5, 5.5, 6, 6.5, 7, 7.5 or 8, for example up to 6 according to ISO14419, say up to or up to and including 4, 4.5, 5, 5.5, 6, 6.5, 7, 7.5 or 8.

In a further aspect, the invention provides for the use of a monomer to form a polymer coating on a fabric, e.g. a textile material, when the monomer is brought into contact with the fabric and the monomer is subjected to low power plasma polymerisation, wherein the monomer comprises the general formula (I), and wherein n is 2 to 6, m is 0 to 9, X and Y are H, F, Cl, Br or I, $R_1$ is H or alkyl, e.g. —$CH_3$, or a substituted alkyl, e.g. an at least partially halo-substituted alkyl, and $R_2$ is H or alkyl, e.g. —$CH_3$ or a substituted alkyl, e.g. an at least partially halo-substituted alkyl.

In order that the invention may be more readily understood, it will now be described by way of example only and with reference to the accompanying drawings, in which:

DETAILED DESCRIPTION OF THE DRAWINGS

Figure 1:
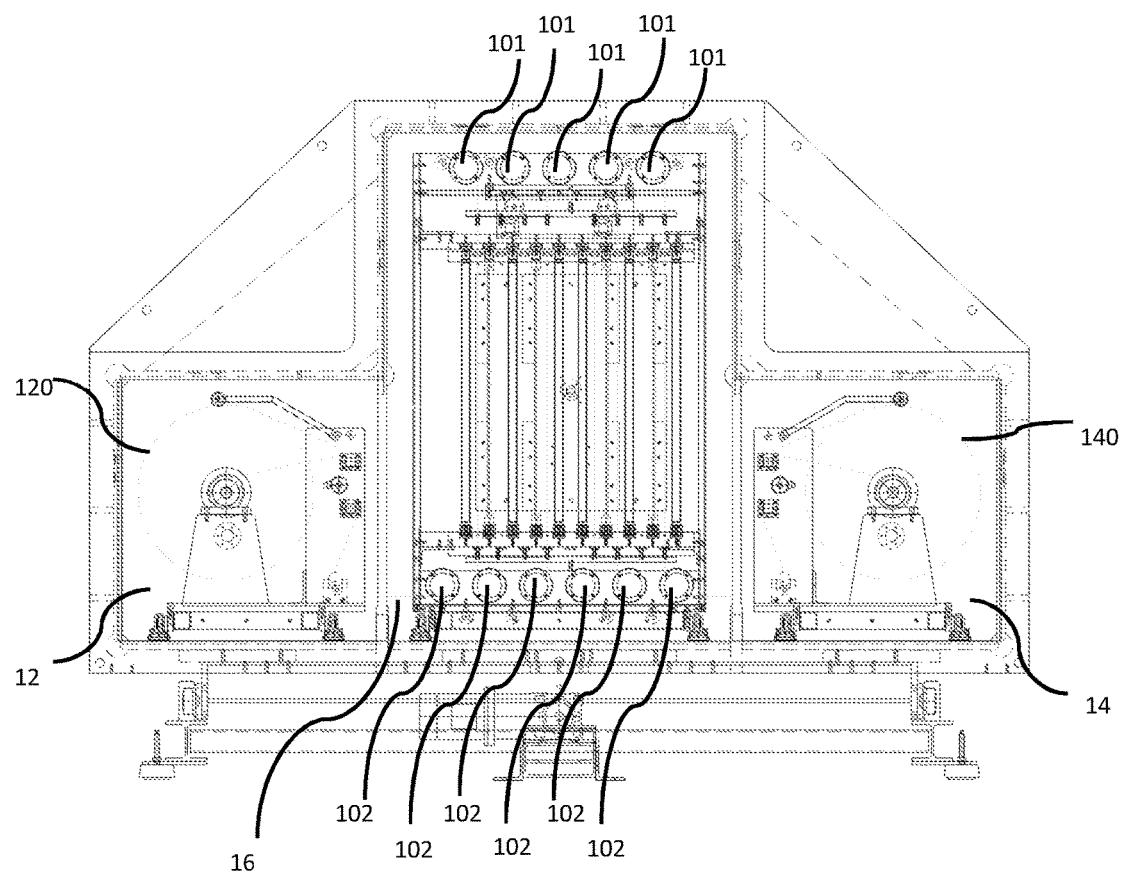
FIG. 1 shows a schematic representation of a roll-to-roll plasma deposition apparatus.

Referring first to FIG. 1 a roll-to-roll plasma deposition apparatus, indicated generally at 1, will now be described. The apparatus 1 comprises a plasma chamber 10, a first compartment 12 and a second compartment 14. The first 12 and second 14 compartments are the unwinding and winding up compartments, arranged at both sides of the plasma chamber. These compartments are known to those skilled in the art and will not be described in any further detail.

The plasma chamber 10 comprises an array of electrode layers RF, M, the arrangement of which will be described in detail further below with reference to FIG. 4. The plasma chamber 10 further comprises a series of upper and lower rollers 101, 102 and load cells for guiding a sheet of textile material 16 between the electrode layers RF, M from a first roll 120 mounted in the first compartment 12 to a second roll 140 mounted in the second compartment 14.

Figure 2:
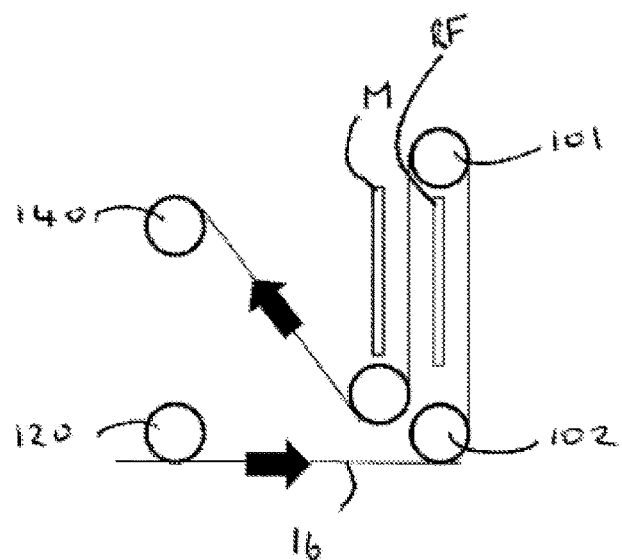
FIG. 2 shows a first electrode arrangement according to the prior art.
Figure 3:
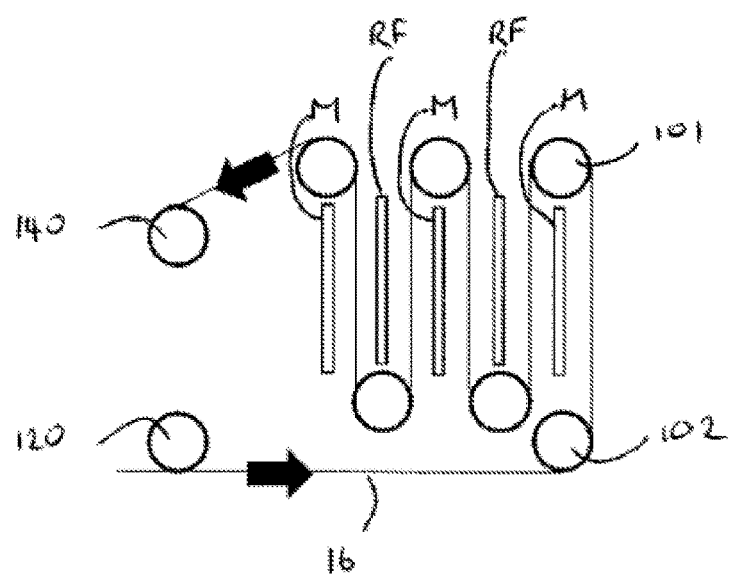
FIG. 3 shows a second electrode arrangement according to the prior art.

Schematic diagrams of electrode layer arrangements according to the prior art are shown in FIGS. 2 and 3. The most basic arrangement is shown in FIG. 2 in which a radiofrequency electrode layer and a ground electrode layer are arranged in a side-by-side relationship. This arrangement may be symbolized as M/RF, where 'M' denotes a ground electrode, 'RF' denotes a radiofrequency electrode, and '/' denotes the space in which the textile material 16 passes. Upper 101 and lower 102 rollers are arranged to guide a sheet of the textile material 16 from one roll 120 to another roll 140. In use, and when an electromagnetic field is applied to the radiofrequency electrode layer RF, plasma is struck between the radiofrequency electrode layer RF and the ground electrode layer M. Such plasma is known as primary plasma. When monomer is present in the plasma chamber 10 this results in a polymer coating being applied to a surface of the sheet of textile material 16 that is facing the radiofrequency electrode layer RF, resulting in a sheet of textile material 16 having a uniform polymer coating applied to a single surface thereof.

FIG. 3 shows a further arrangement in which additional radiofrequency electrode layers RF and ground electrode layers M are arranged alternately in a side-by-side relationship. This arrangement may be symbolized as M/RF/M/RF/M. Again, primary plasma is struck between a radiofrequency electrode layer RF and a ground electrode layer M such that a polymer coating is applied to a surface of the sheet of textile material 16 that is facing the radiofrequency electrode layer RF. The sheet of textile material 16 makes four passes and on each pass the same side of the textile material 16 facing the radiofrequency electrode layer RF is coated, resulting in a sheet of textile material 16 having a uniform polymer coating applied to a single surface thereof.

Figure 4:
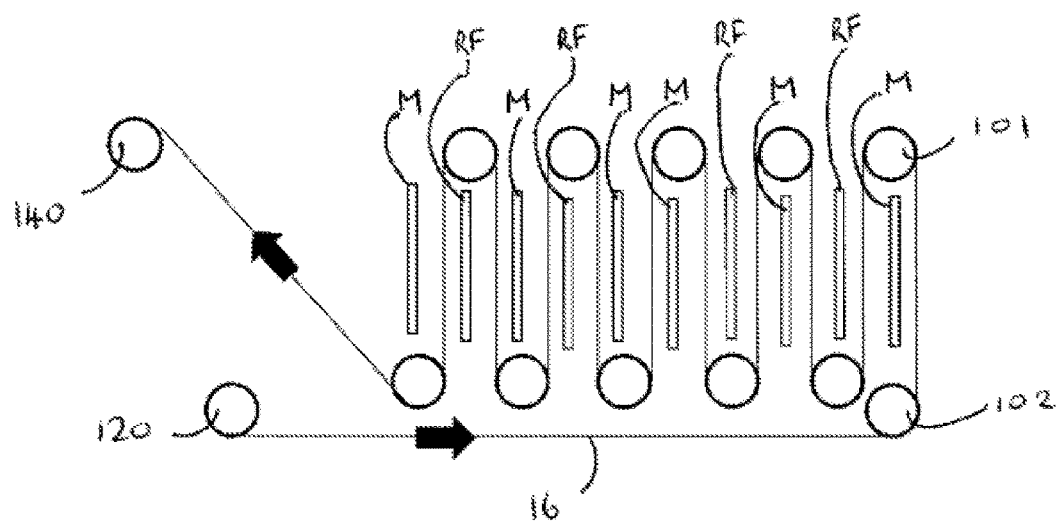
FIG. 4 shows a first electrode arrangement according to the present invention.

In a first embodiment of the invention the electrode arrangement comprises ten electrode layers arranged in sequence as shown in FIG. 4. This arrangement may be symbolized as M/RF/M/RF/M/M/RF/M/RF/M (this represents the arrangement as shown in FIG. 1). In use, and when an electromagnetic field is applied to the radiofrequency electrode layer, plasma is struck between the electrode layers. A primary plasma is struck between a radiofrequency electrode layer RF and a ground electrode layer M. Therefore, whilst it is clear that the sheet of textile material 16 makes nine passes in passages P between the electrode layers, only the first four and last four passes are through primary plasma zones. Accordingly, during the first four passes monomer is polymerised onto a first side of the sheet of textile material 16 whilst during the last four passes monomer is polymerised onto the obverse side (second side) of the sheet of textile material 16, resulting in a sheet of textile material 16 having a uniform polymer coating applied to each surface thereof. During the fifth pass an insignificant quantity to no monomer is deposited onto the sheet of textile material 16.

Figure 5:
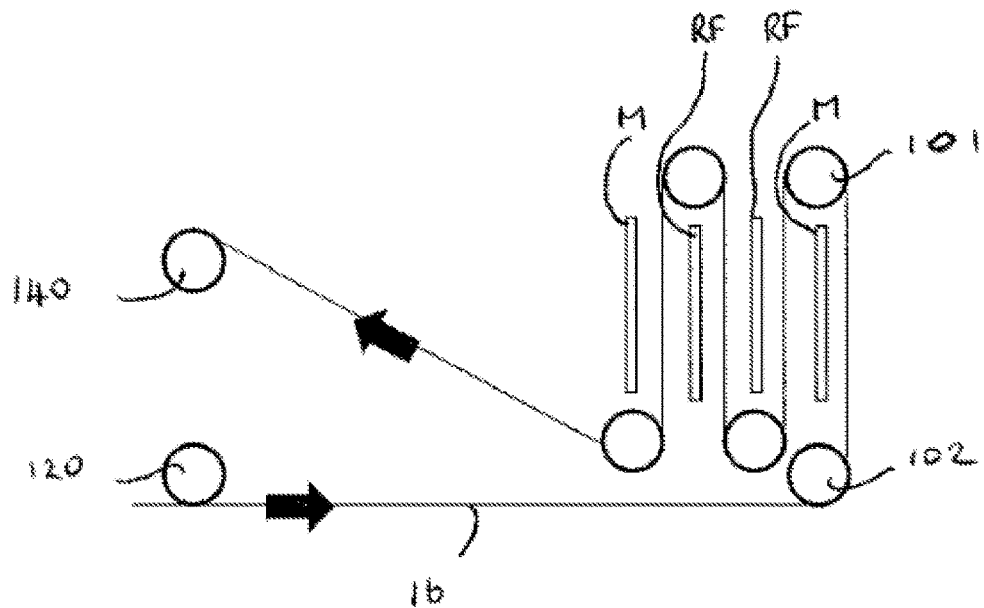
FIG. 5 shows a second electrode arrangement according to the present invention.

FIG. 5 shows a second simplified embodiment of the invention in which the electrode arrangement comprises four electrode layers arranged in sequence. This arrangement may be symbolized as M/RF/RF/M. In use, and when an electromagnetic field is applied to the radiofrequency electrode layer, plasma is struck between the electrode layers. A primary plasma is struck between a radiofrequency electrode layer RF and a ground electrode layer M. Therefore, whilst it is clear that the sheet of textile material 16 makes three passes in passages P between the electrode layers, only the first and third passes are through primary plasma zones. Accordingly, during the first pass monomer is polymerised onto a first side of the sheet of textile material 16 whilst during the third pass monomer is polymerised onto the obverse side of the sheet of textile material 16, resulting in a sheet of textile material 16 having a uniform polymer coating applied to each surface thereof. During the second pass an insignificant quantity to no monomer is deposited onto the sheet of textile material 16.

In a third embodiment the electrode layers may be arranged as follows: RF/M/M/RF. Similarly, when an electromagnetic field is applied to the radiofrequency electrode layers, plasma is struck between the electrode layers. A primary plasma is struck between a radiofrequency electrode layer and a ground electrode layer. Therefore, whilst it is clear that the sheet of textile material 16 makes three passes between the electrode layers, only the first and third passes are through primary plasma zones. Accordingly, during the first pass monomer is polymerised onto a first side of the sheet of textile material 16 whilst during the third pass monomer is polymerised onto the obverse side of the sheet of textile material 16, resulting in a sheet of textile material 16 having a uniform polymer coating applied to each surface thereof. During the second pass an insignificant quantity to no monomer is deposited onto the sheet of textile material 16.

The applicant has surprisingly discovered that the polymer coating has greater uniformity, as found when measurements were made in testing, e.g. in contact angles for water and/or greater uniformity in oil repellency, when the ground electrode layers are placed at the outer positions as described in the first and second embodiments.

In order to coat each side of the fabric the applicant has discovered that it is important to have a pair of identical electrode layers side-by-side in the series. For instance a pair of ground electrode layers, as described in the first or third embodiments, or a pair of radiofrequency electrode layers, as described in the second embodiment. This inventive arrangement results in the switching of polymer deposition from one side of the sheet of textile material 16 to another.

In further embodiments additional arrangements may be envisaged. For instance, RF/M/RF/RF/M/RF or M/RF/M/M/RF/M. In these embodiments it is clear that the sheet of textile material 16 makes five passes between the electrode layers: the first, second, fourth and fifth passes being through primary plasma zones. Accordingly, during the first and second passes monomer is polymerised onto a first side of the sheet of textile material 16 whilst during the fourth and fifth passes monomer is polymerised onto the obverse side of the sheet of textile material 16, resulting in a sheet of textile material 16 having a uniform polymer coating applied to each surface thereof. During the third pass insignificant to no monomer is deposited onto the sheet of textile material 16.

Similarly, even further embodiments are envisaged having additional electrode layers incorporated into the sequence, e.g. M/RF/M/RF/RF/M/RF/M or RF/M/RF/M/M/RF/M/RF or RF/M/RF/M/RF/RF/M/RF/M/RF or M/RF/M/RF/M/M/RF/M/RF/M or M/RF/M/RF/M/RF/RF/M/RF/M/RF/M or RF/M or RF/M/RF/M/RF/M/M/RF/M/RF/M/RF and so on. As the number of electrode layers increases in the series so does the number of passes through a primary plasma zone. Accordingly, it is possible to control the thickness of the resultant polymer layer by increasing or decreasing the number of electrode layers in the sequence. Also, by increasing the number of electrode layers in the sequence it is possible to increase the speed within which the sheet of textile material 16 passes through the plasma chamber 10 without compromising on the quality of the polymer layer.

Figure 6:
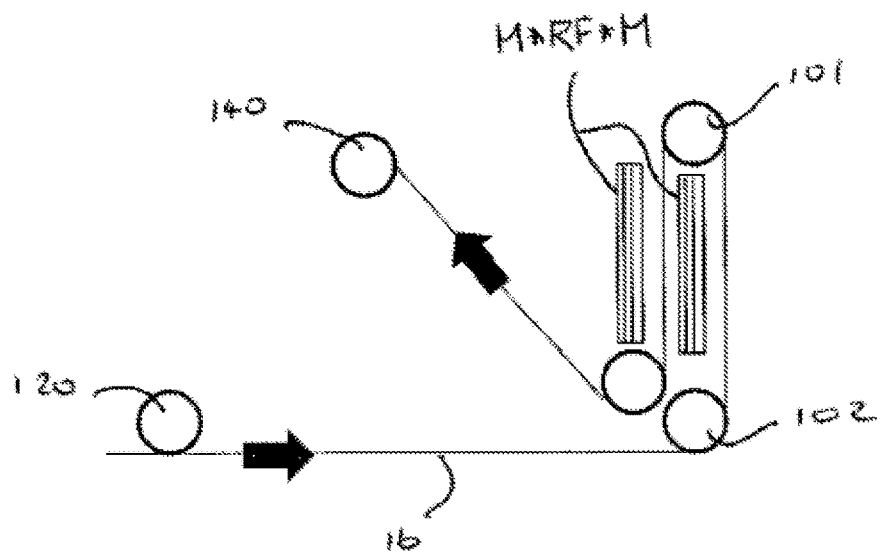
FIG. 6 shows a third electrode arrangement according to the present invention.

In a further embodiment shown in FIG. 6 the electrode layers are arranged as follows: M*RF*M/M*RF*M, where 'RF' denotes a radiofrequency electrode, 'M' denotes a ground electrode, '*' denotes a primary plasma zone and '/' denotes the space in which the fabric passes in passages P. In this embodiment the plasma chamber 10 comprises a first electrode set (M*RF*M) and a second electrode set (M*RF*M), wherein the first and second electrode sets comprise electrode layers and wherein each electrode set comprises two ground electrode layers M and a single radiofrequency electrode layer RF. In this embodiment it is clear that the sheet of textile material 16 makes a single pass between the electrode sets (M*RF*M).

Although it is neither wished nor intended to be bound by any particular theory, it will be understand that the plasma created in between electrode sets (M*RF*M) of this embodiment of the invention cannot be described as either a pure primary or as a pure secondary plasma. Rather, it is to be understood that the electrode sets (M*RF*M) create a new hybrid form of plasma which is strong enough to start and maintain a polymerisation reaction at very low power, but which at the same time is benign enough not to break down the reactive monomers. Accordingly, during the first pass monomer is polymerised onto first and second sides of the sheet of textile material 16, resulting in a sheet of textile material 16 having a uniform polymer coating applied to each surface thereof.

Figure 7:
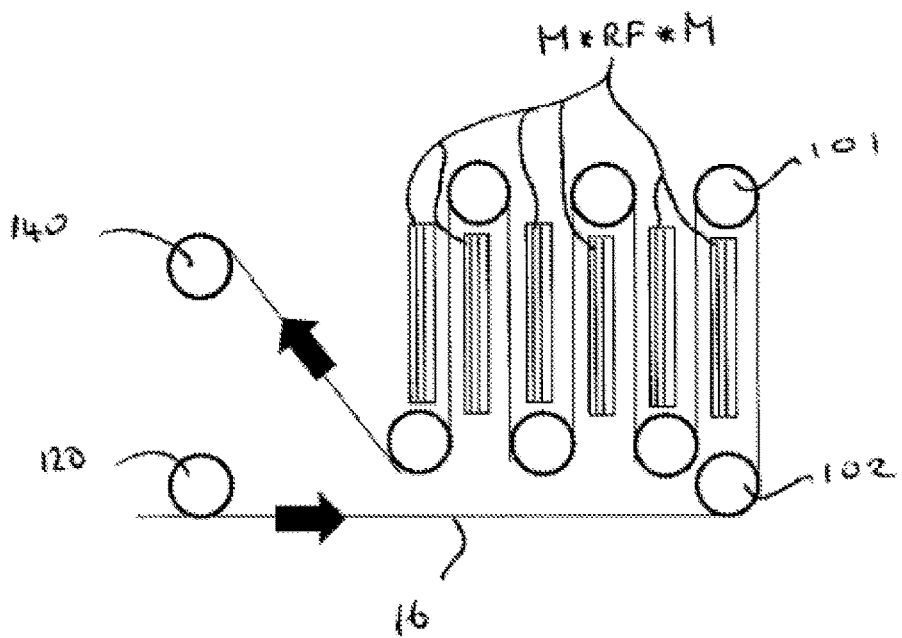
FIG. 7 shows a fourth electrode arrangement according to the present invention.

The processing speeds may be increased by adding further electrode sets (M*RF*M) to the plasma chamber 10, for example third, fourth, fifth and sixth electrode sets (M*RF*M) and so on. For example when adding a third electrode set (M*RF*M), the sheet of textile material 16 is coated on both sides in two passes in passages P, e.g. M*RF*M/M*RF*M/M*RF*M or RF*M*RF/RF*M*RF/RF*M*RF. FIG. 7 shows an example of an electrode arrangement having six electrode sets (M*RF*M) arranged in sequence. In this design, contrary to FIG. 1, the unwinding and the winding up takes place in the same area at the same side of the plasma chamber, although it will be appreciated that winding up could take place at opposite sides of the plasma chamber depending on e.g. the dimensions of the apparatus 1 and/or the plasma chamber 10 etc.

Figure 8:
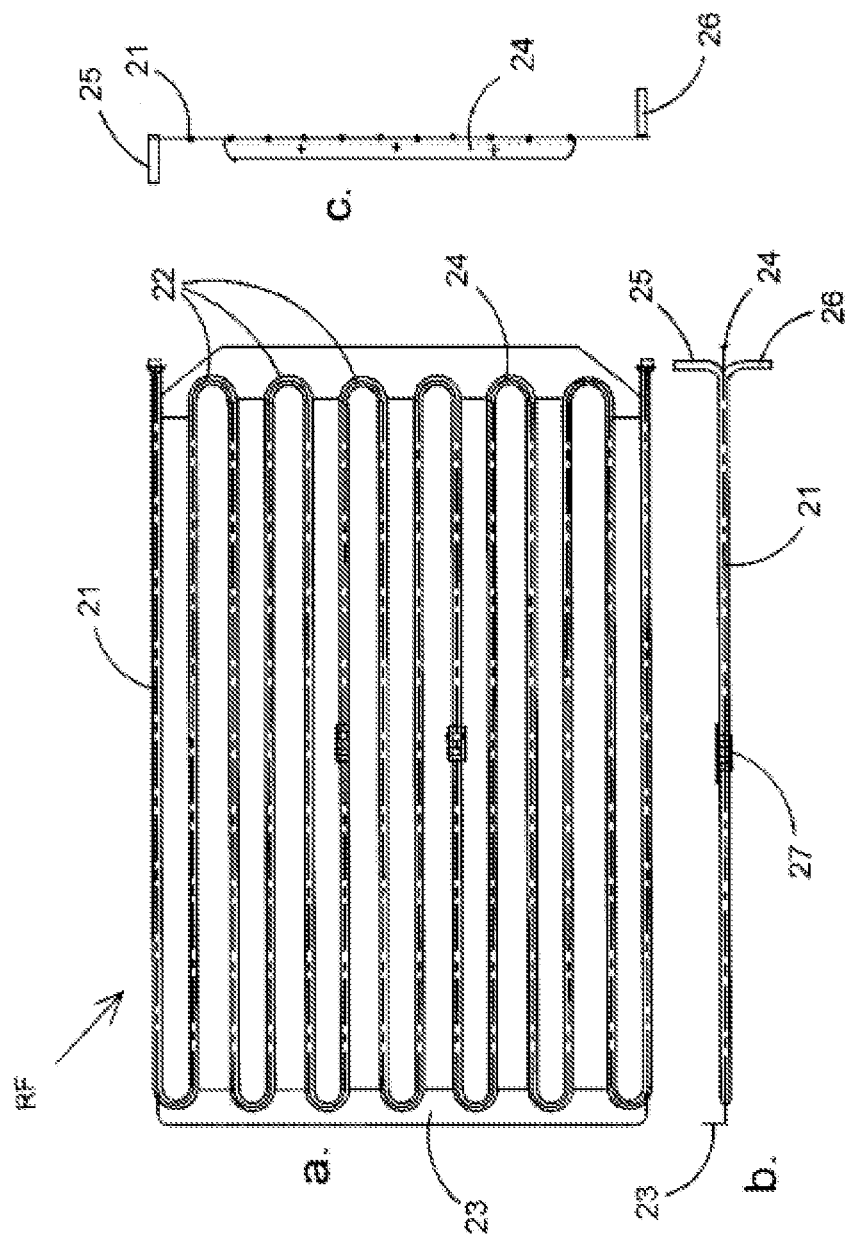
FIG. 8 shows plan (a), side (b) and end (c) views of a radiofrequency electrode.

FIG. 8 shows a radiofrequency electrode layer (RF) in plan (a), side (b) and end (c) views. The radiofrequency electrode layer RF comprises a generally planar body formed from folded tubing 21. The tubing 21 may comprise a plurality of sections which are joined together by connectors 27. The tubing 21 is typically formed of a conductive metallic material such as aluminium, stainless steel or copper. The tubing 21 is hollow to allow for a temperature regulation fluid to be passed through the electrode layer RF to regulate the plasma at a predetermined temperature. The tubing 21 comprises a series of bends 22 formed at regular intervals along the tubing length. The tubing 21 curves back on itself at each bend 22 by approximately 180°. The tubing 21 has a diameter of approximately 10 mm and a wall thickness of approximately 2 mm. The distance between the tubing 21 before and after each bend 22 is approximately 5 times the diameter of the tubing 21.

The tubing 21 is curved at each end so as to provide distal portions 25, 26 which are substantially orthogonal to the planar body. The distal portions 25, 26 may be connected to a fluid supply or egress line (not shown). Alternatively, the distal portions 25, 26 may be connected to the distal portions of adjacent or nearby electrode layers.

The radiofrequency electrode layer RF further comprises a pair of connecting plates 23, 24 attached to the front and to the rear of the electrode layer 20 adjacent to the bends 22. The connecting plates 23, 24 provide both a means for attaching the radiofrequency electrode layer RF to the inside of the vacuum chamber 11 and electrical contacts for applying a load thereto.

A ground electrode layer M (not shown in detail) typically comprises a planar sheet of aluminium.

An example sequence of depositing a polymer coating to a roll of fabric is as follows:
1. A roll of fabric 120 to be treated is mounted in a first compartment 12 of the apparatus 1;
2. The free end of the fabric 16 is fed (manually or automatically) through the rollers 101, 102 within the plasma chamber 10 and then secured to an empty roll 140 in a second compartment 14;
3. The plasma chamber 10 is closed and the electrodes, which are mounted on the moving part of the machine, are slid in between the guiding rolls (and thus in between the textile);
4. The plasma chamber 10 is sealed and pumped down to the required predetermined base pressure;
5. The load cells are calibrated for optimal processing;
6. Gas inlet valve is opened and the evaporated liquid monomer is fed into the plasma chamber 10 in a controlled manner at a controlled rate;
7. An electromagnetic field is applied to the radiofrequency electrode layers RF and a low power continuous wave plasma is generated;
8. Power is applied to the rollers 101, 102 of the apparatus 1 in order to unwind fabric 16 from first roll 120, and wind it onto a second roll 140, during which time it passes between the electrode layers RF, M or sets of electrode layers M*RF*M, RF*M*RF where a polymer coating is deposited to each side of the fabric 16 before being wound onto second roll 140;
9. Once all of the fabric 16 has had a polymer coating applied thereto, the electromagnetic field is turned off and the plasma chamber 10 is ventilated to atmospheric pressure.

A second example sequence of depositing a polymer coating to a roll of fabric, e.g. in large production machines having for example a 9000 liter (l) chamber, is as follows:
1. A roll of fabric 120 to be treated is mounted in a first compartment 12 of the apparatus 1;
2. The free end of the fabric 16 is fed (manually or automatically) through the rollers 101, 102 within the plasma chamber 10 and then secured to an empty roll 140 in a second compartment 14;
3. The plasma chamber 10 is closed and the guiding rolls and all the textile (on roll in the unwinding area, the free end of the fabric mounted on a core in the winding up area, and the textile guided through the guiding rolls), which are mounted on the moving part of the machine, are fed in between the electrodes;
4. The plasma chamber 10 is sealed and pumped down to a predetermined base pressure required for outgassing and pre-treatment;
5. The load cells are calibrated for optimal processing;
6. The gas inlet valve is opened and the gas for the pre-treatment, e.g. cleaning and/or activation and/or etching, which is combined with further gassing out of the textile prior to coating, is fed into the plasma chamber 10;
7. An electromagnetic field is applied to the radiofrequency electrode layers RF and a plasma is generated; this plasma may be either a continuous wave plasma or a pulsed wave plasma, the choice of plasma mode being dependent upon the required power level and determined to be optimum for the pre-treatment gas or gases used and/or for the size and design of the plasma equipment and/or for a particular textile being used;
8. Power is applied to the rollers 101, 102 of the apparatus 1 in order to unwind fabric 16 from first roll 120, and wind it onto a second roll 140, during which time it passes between the electrode layers RF, M or sets of electrode layers M*RF*M, RF*M*RF where moisture is removed from fabric 16 and where each side of the fabric 16 is pre-treated before being wound onto second roll 140;
9. Once all of the fabric 16 has been gassed out and pre-treated, the electromagnetic field is turned off and the plasma chamber 10 is pumped to the required lower base pressure for polymer layer deposition;
10. Gas inlet valve is opened and the evaporated liquid monomer is fed into the plasma chamber 10 in a controlled manner at a controlled rate;
11. An electromagnetic field is applied to the radiofrequency electrode layers RF and a low power plasma is generated; this plasma may be either a continuous wave plasma or a pulsed wave plasma, the choice of plasma mode being dependent upon the power level needed and determined to be optimum for a particular monomer being used to treat the material being treated and/or for the size and/or the design of the plasma equipment and/or for a particular textile being used;

12. Power is applied to the rollers 101, 102 of the apparatus 1 and fabric 16 is unwound from roll 140, passes between the electrode layers RF, M or sets of electrode layers M*RF*M, RF*M*RF, whereby a polymer coating is deposited to each side of the fabric 16 before being wound onto roll 120;

13. Once all of the fabric 16 has had a polymer coating applied thereto, the electromagnetic field is turned off and the plasma chamber 10 is ventilated to atmospheric pressure.

Example 1

An experiment was carried out on small rolls of a textile for use as a filtration media before scaling up to production level. The textile comprised a nonwoven synthetic material comprising polymer fibres. The roll was 1000 m long and 1.1 m wide.

Two different processes are performed, and their process parameters are presented in Tables 1 and 2.

TABLE 1

| Parameter | Value |
| --- | --- |
| Liquid Monomer Supply (LMS) | |
| Temperature canister | 130-150° C. |
| Temperature LMS | 140-150° C. |
| Plasma Zone | |
| Length of plasma zone | 6 m |
| Treatment speed | 2 m/min |
| Tension | 1.5 kg (15N) |
| Temperature walls | 40-50° C. |
| Electrodes & Generator | |
| Electrode configuration | M/RF/M/RF/RF/M/RF/M |
| Plasma type | Primary |
| Power | 100-500 W |
| Frequency | 13.56 MHz |
| Frequency mode | cw |
| Temperature RF electrode | 30-35° C. |
| Monomer | 1H,1H,2H,2H-Perfluorooctyl acrylate |
| Flow | 40-100 sccm |
| Pressure | |
| Base pressure | 10-50 mTorr |
| Work pressure | 20-80 mTorr |
| Residence time in plasma zone | 3 minutes |
| Oleophobicity Level (ISO 14419-2010) | 5 |

TABLE 2

| Parameter | Value |
| --- | --- |
| Liquid Monomer Supply (LMS) | |
| Temperature canister | 130-150° C. |
| Temperature LMS | 140-150° C. |
| Plasma Zone | |
| Length of plasma zone | 6 m |
| Treatment speed | 2 m/min |
| Tension | 1.5 kg (15N) |
| Temperature walls | 40-50° C. |
| Electrodes & Generator | |
| Electrode configuration | M/RF/M/RF/RF/M/RF/M |
| Plasma type | Primary |
| Power | 500-1000 W |
| Frequency | 13.56 MHz |
| Frequency mode | pulsed ($10^2$-$10^4$ Hz; duty cycle 0.1-20%) |
| Temperature RF electrode | 30-35° C. |
| Monomer | 1H,1H,2H,2H-Perfluorooctyl methacrylate |
| Flow | 40-100 sccm |
| Pressure | |
| Base pressure | 10-50 mTorr |
| Work pressure | 20-80 mTorr |
| Residence time in plasma zone | 3 minutes |
| Oleophobicity Level (ISO 14419-2010) | 3 |

The resultant coated textile according to Table 1 demonstrated good hydro- and oleophobic properties as well as efficient filtration so it was decided to scale up the process.

The resulting hydro- and oleophobic properties of the textiles coated with the process according to Table 2 are lower than from the coated textiles according to Table 1. However, it is decided to scale up this process as well.

Example 2

The processes of example 1 were increased in scale. The textile material was the same as that of example 1. The roll was 10000 m long and 1.1 m wide.

The process parameters are presented in Tables 3 and 4.

TABLE 3

| Parameter | Value |
| --- | --- |
| Liquid Monomer Supply (LMS) | |
| Temperature canister | 130-150° C. |
| Temperature LMS | 140-150° C. |
| Plasma Zone | |
| Length of plasma zone | 12 m |
| Treatment speed | 4 m/min |
| Tension | 1.5 kg (15N) |
| Temperature walls | 40-50° C. |
| Electrodes & Generator | |
| Electrode configuration | M/RF/M/RF/M/RF/RF/M/RF/M/RF/M |
| Plasma type | Primary |
| Power | 200-800 W |
| Frequency | 13.56 MHz |
| Frequency mode | cw |
| Temperature RF electrode | 30-35° C. |
| Monomer | 1H,1H,2H,2H-Perfluorooctyl acrylate |
| Flow | 50-120 sccm |
| Pressure | |
| Base pressure | 30-50 mTorr |
| Work pressure | 70-90 mTorr |
| Residence time in plasma zone | 3 minutes |
| Oleophobicity Level (ISO 14419-2010) | 5 |

TABLE 4

| Parameter | Value |
|---|---|
| Liquid Monomer Supply (LMS) | |
| Temperature canister | 130-150° C. |
| Temperature LMS | 140-150° C. |
| Plasma Zone | |
| Length of plasma zone | 12 m |
| Treatment speed | 4 m/min |
| Tension | 1.5 kg (15N) |
| Temperature walls | 40-50° C. |
| Electrodes & Generator | |
| Electrode configuration | M/RF/M/RF/M/RF/RF/M/RF/M/RF/M |
| Plasma type | Primary |
| Power | 700-1200 W |
| Frequency | 13.56 MHz |
| Frequency mode | pulsed ($10^2$-$10^4$ Hz; duty cycle 0.1-20%) |
| Temperature RF electrode | 30-35° C. |
| Monomer | 1H,1H,2H,2H-Perfluorooctyl methacrylate |
| Flow | 50-120 sccm |
| Pressure | |
| Base pressure | 30-50 mTorr |
| Work pressure | 70-90 mTorr |
| Residence time in plasma zone | 3 minutes |
| Oleophobicity Level (ISO 14419-2010) | 3 |

The resultant coated textile according to Table 3 demonstrated good hydro- and oleophobic properties as well as efficient filtration. The resulting hydro- and oleophobic properties of the textiles coated with the process according to Table 4 are lower than from the coated textiles according to Table 3.

Results

Oil Repellency

Examples 1 and 2 show that low power continuous wave plasma polymerisation processes provide a better performance than pulsed wave plasma polymerisation processes. This is demonstrated by the oil repellency which is tested according to ISO 14419.

The results are presented in Table 5, and show that the oil repellency for continuous wave coatings of A4 sheets is higher than for pulsed wave coatings, the effect being more pronounced for short treatment times, e.g. 2 minutes.

TABLE 5

Oil repellency for continuous wave and pulsed wave

| Deposition mode | Treatment time (min) | Oil repellency |
|---|---|---|
| Continuous wave (cw) | 2 minutes | L 6 |
| Pulsed | 2 minutes | L 3 |
| Continuous wave (cw) | 5 minutes | L 6 |
| Pulsed | 5 minutes | L 4 |

Filtration Efficiency

The filtration efficiency for standard filtration media and filtration media coated in accordance with the present invention were tested for three different grades of High Efficiency Particulate Arresting (HEPA) filter elements (grades F7, F8 and F9). Grades F7, F8 and F9 are indications given to secondary filter elements depending on their efficiency they should reach according to the BS EN 779 test standard. The required efficiency in use (middle efficiency) depends on the particle size to be filtered.

For 0.4 μm particles, F7 grades should obtain a middle efficiency of 80-90%.

For 0.4 μm particles, F8 grades should obtain a middle efficiency of 90-95%).

For 0.4 μm particles, F9 grades should obtain a middle efficiency of more than 95%.

The filtration of this test media is charged, i.e. to form an electret, and may be used in heating, ventilation or air conditioning (HVAC) systems.

The initial and the middle filtration efficiency for 0.4 μm pores is measured according to standard European air filter test BS EN 779 for the standard filtration media and plasma coated filtration media in charged form and in discharged form. The filtration media is discharged by bringing into contact with isopropanol.

The initial filtration efficiency is the efficiency of a clean, brand new filter element. It is obvious that once the filter is in use, its pores become blocked by filtered particles, and by consequence its efficiency increases during lifetime. The initial efficiency is thus the minimal efficiency.

The results for the first fabric grade F7 are presented in Table 6. In order to pass the test the required average efficiency is 80 to 90% and the initial efficiency is 35% or more.

TABLE 6

| Type of filter | Standard F7-charged | Standard F7-discharged | Plasma treated F7-charged | Plasma treated F7-discharged |
|---|---|---|---|---|
| Initial efficiency 0.4 μm | 55% | 39% | 70% | 64% |
| Average efficiency 0.4 μm | 85% | — | 87% | 87% |

From Table 6 it is clear that the initial filtration efficiency for charged filter elements coated with an inventive coating is enhanced. Once the filters are discharged, the initial and average efficiency for standard filters drops highly, while the plasma treated filter elements do not show an efficiency drop for the average efficiency and a slight drop for the initial efficiency.

The results for the second fabric grade F8 are presented in Table 7. In order to pass the test the required average efficiency is 90 to 95% and the initial efficiency is 55%.

TABLE 7

| Type of filter | Standard F8-charged | Standard F8-discharged | Plasma treated F8-charged | Plasma treated F8-discharged |
|---|---|---|---|---|
| Initial efficiency 0.4 μm | 50% | 33% | 80% | 87% |
| Average efficiency 0.4 μm | 83% | 76% | 92% | 94% |

From Table 7 it is clear that the initial and average filtration efficiency for charged filter elements coated with an inventive coating is enhanced. Once the filters are discharged, the initial and average efficiency for standard filters drops, while the plasma treated filter elements do show an efficiency increase for the average efficiency and for the initial efficiency.

The standard filter elements do not have the required average efficiency of 90-95%, while the plasma coated filters reach the spec for both charged and discharged.

The standard filter elements do not have the required initial efficiency of 55%, while the plasma coated filters reach the spec for both charged and discharged.

Filtration efficiency is enhanced for discharged filter elements coated with an inventive coating. After discharge with isopropanol, the coating is still on the filter element preventing the latter from showing a decrease in efficiency.

Penetration of Dispersed Oil Particles (DOP)

Respirator masks having five layers of nonwoven meltblown polypropylene (15-30 g/m$^2$) are electrostatically charged after coating with a coating according to Example 1. Evaluation of the penetration is done using a Certitest 8130 apparatus loading the textile with 200 mg of DOP-particles. The results are presented in Table 8.

TABLE 8

| Filter medium | Conditioning | Initial penetration (%) | Penetration after (x) minutes (%) |
|---|---|---|---|
| Supplier I-28 g/m$^2$ | Uncoated | 1.20 | 6.40 (30) |
| Supplier I-28 g/m$^2$ | Plasma coated | 0.48 | 1.08 (30) |
| Supplier I-22 g/m$^2$ | Uncoated | 1.25 | 3.90 (10) |
| Supplier I-22 g/m$^2$ | Plasma coated | 0.40 | 0.75 (10) |
| Supplier II-25 g/m$^2$ | Uncoated | N.A. | N.A. |
| Supplier II-25 g/m$^2$ | Plasma coated | 0.02 | 0.03 (10) |

It is clear from Table 8 that the plasma coated materials perform much better than the uncoated reference materials. The initial penetration is about 3 times less; the penetration after 10 to 30 minutes is 5 to 6 times less. The filtration efficiency for oily particles is enhanced by using an inventive coating.

Filter Efficiency

Diesel filters made of approximately 1 to 2 mm thick nonwoven polyethylene terephthalate (PET) of 500 g/m$^2$ are coated with an inventive coating according to Example 2.

The efficiency is tested by soaking the filter elements in water for 22 hours, followed by a drip out of a certain time (minute range) in vertical position. The weight increase is calculated and compared to non-coated reference samples of the same material.

Figure 9:
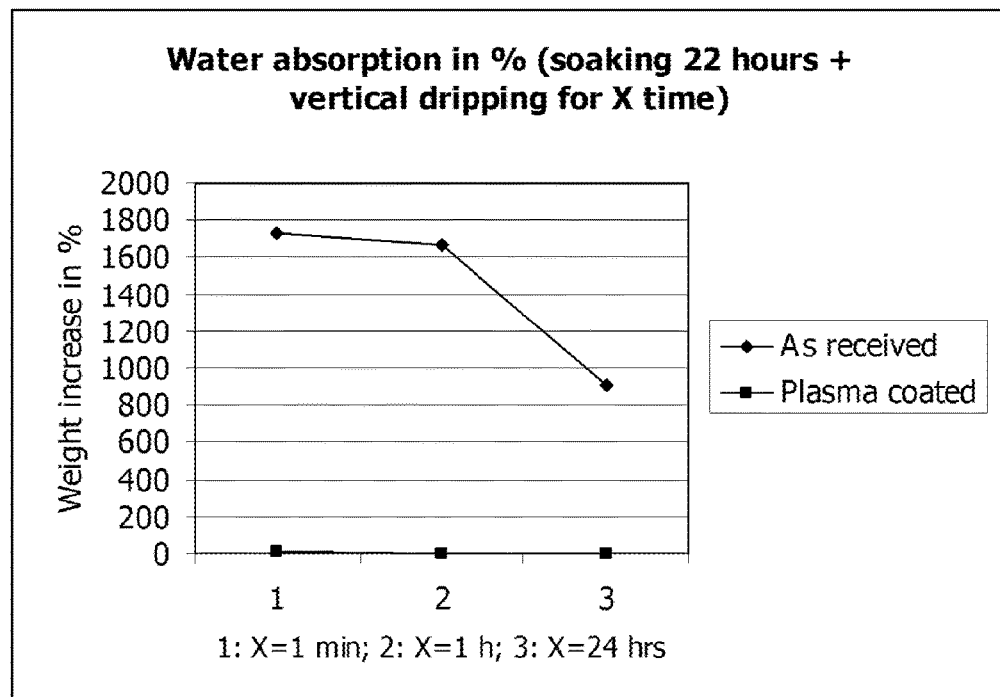
FIG. 9 shows the water absorption in % in function on the time.

The results are presented in the graph of FIG. 9.

From the graph of FIG. 9 it is clear that uncoated material absorbs a high volume of water, almost 1800% weight increase after 1 minute drip out.

Samples coated with an inventive coating show extremely low water absorption values, less than 10% weight increase after 1 minute drip out.

Washability

Three different polyester woven fabrics coated with a low power plasma coating according to Table 3 from Example 2 have been washed according to ISO 15797 (2002).

One complete washing cycle comprised the following steps:
 1. Washing at 60° C. and using 20 g IPSO HF 234 without optical whitener per kilogram dry textile material;
 2. Tumble drying;
 3. Hot pressing at 180° C. (e.g. ironing).

Five washing cycles have been performed one after the other, then the oil repellency was measured according to ISO 14419 and a spray test was performed according to ISO 9073—part 17 and ISO 4920.

Next, five more washing cycles have been done and the oil repellency test and spray test have been repeated.

Figure 10:
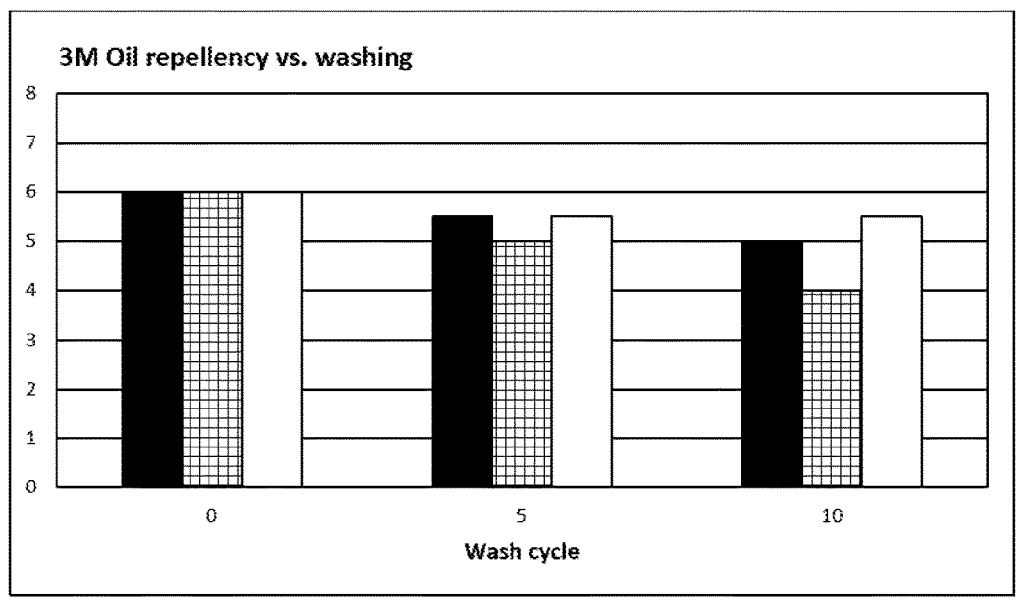
FIG. 10 shows the oil repellency in function of the number of washing cycles.
Figure 11:
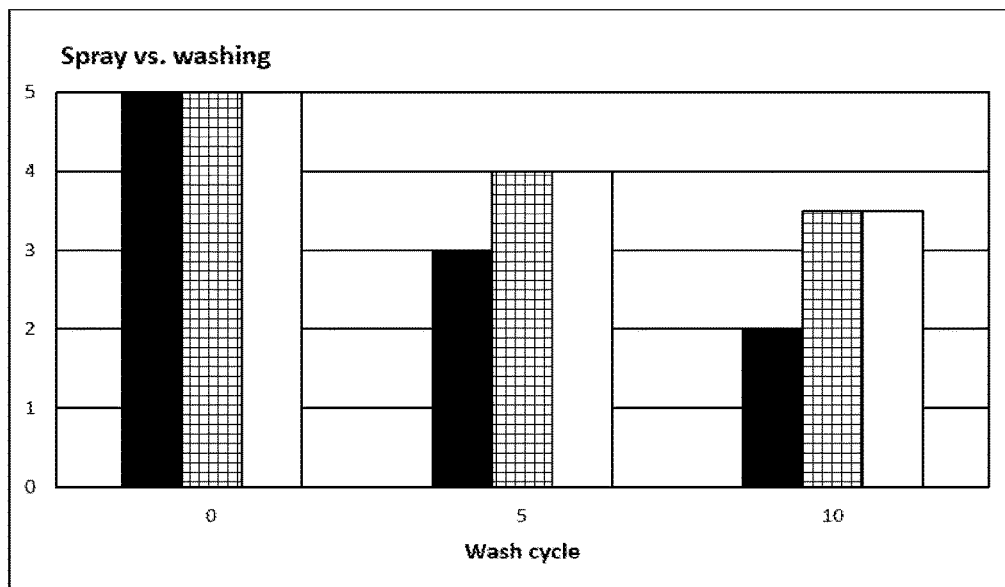
FIG. 11 shows the spray test results in function of the number of washing cycles.

The oil repellency in function of the number of washing cycles is presented in the graph of FIG. 10. The graph of FIG. 11 shows the spray test results in function of the number of washing cycles.

In a further example, another polyester woven fabric has been coated with and without a pre-treatment prior to the coating step. The process without pre-treatment is carried out according to Example 1.

The process parameters for the process with pre-treatment are presented in Table 12.

TABLE 12

| Parameter | Value |
|---|---|
| Pre-treatment | |
| Gas | Argon |
| Flow | 500-1000 sccm |
| Treatment speed | 6 m/min |
| Power | 500-750 W |
| Frequency | 13.56 MHz |
| Frequency mode | cw |
| Liquid Monomer Supply (LMS) | |
| Temperature canister | 130-150° C. |
| Temperature LMS | 140-150° C. |
| Plasma Zone | |
| Length of plasma zone | 6 m |
| Coating step speed | 2 m/min |
| Tension | 1.5 kg (15N) |
| Temperature walls | 40-50° C. |
| Electrodes & Generator | |
| Electrode configuration | M/RF/M/RF/RF/M/RF/M |
| Plasma type | Primary |
| Power during coating | 100-500 W |
| Frequency | 13.56 MHz |
| Frequency mode | cw |
| Temperature RF electrode | 30-35° C. |
| Monomer | 1H,1H,2H,2H-Perfluorooctyl acrylate |
| Flow | 40-100 sccm |
| Pressure | |
| Base pressure | 10-50 mTorr |
| Work pressure | 20-80 mTorr |
| Residence time in plasma zone during coating | 3 minutes |
| Oleophobicity Level (ISO 14419-2010) | 5 |

The coated textiles have been washed according to ISO 15797 (2002).

One complete washing cycle comprised the following steps:
 1. Washing at 75° C. and using 20 g IPSO HF 234 without optical whitener per kilogram dry textile material;
 2. Drying in a drying cabinet;

After one washing cycle the oil repellency was measured according to ISO 14419 and a spray test was performed according to ISO 9073—part 17 and ISO 4920.

Next, four more washing cycles have been completed and the oil repellency test and spray test have been repeated (values measured after 5 washings).

Next, five more washing cycles have been done and the oil repellency test and spray test have been repeated (values measured after 10 washings).

Figure 12:
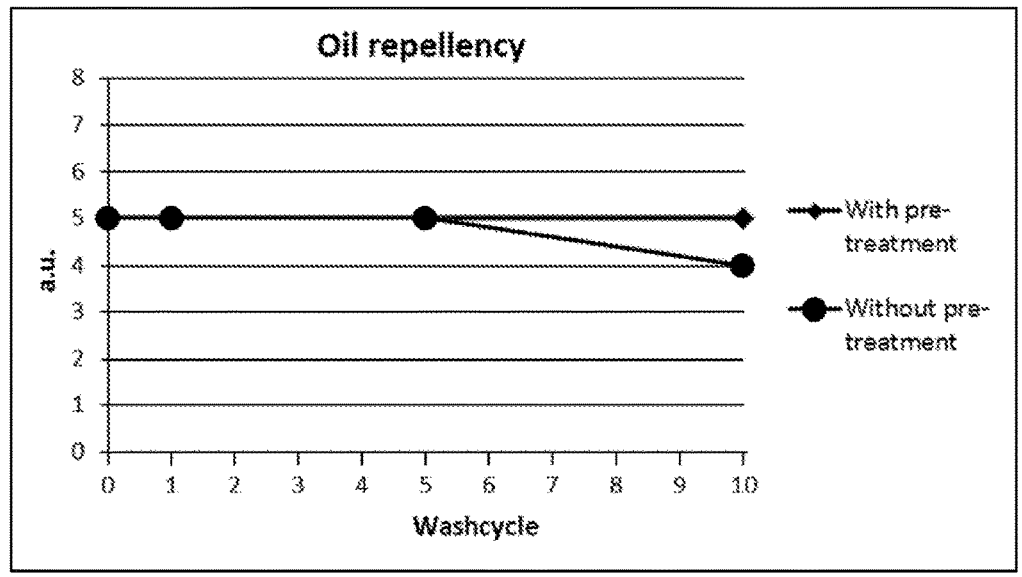
FIG. 12 shows the oil repellency as a function of the number of washing cycles.

The oil repellency as a function of the number of washing cycles is presented in the graph of FIG. 12. The graph of FIG. 13 shows the spray test results in function of the number of washing cycles.

Figure 13:
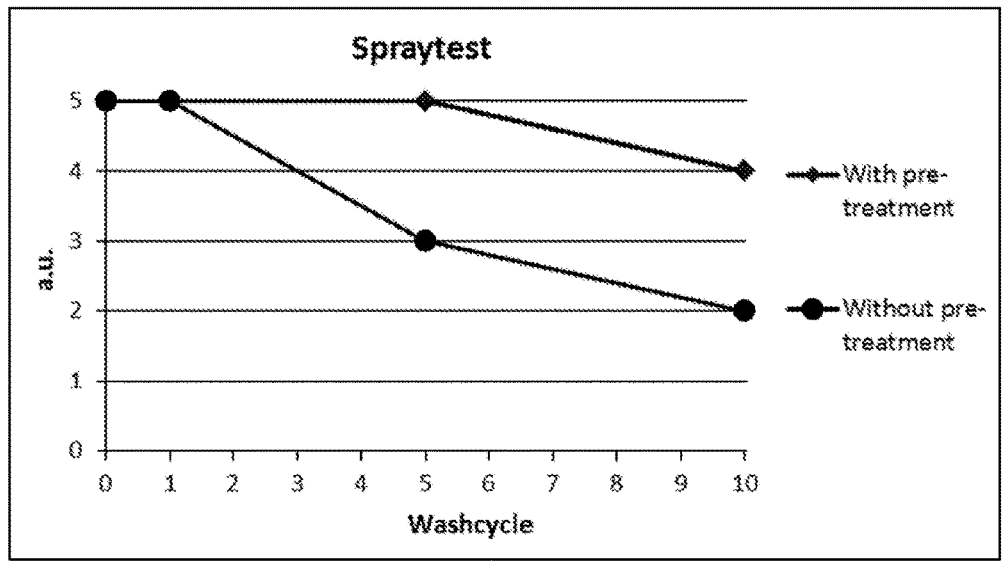
FIG. 13 shows the spray test results in function of the number of washing cycles.

From the graphs of FIGS. 12 and 13 it is clear that the textile samples that were pre-treated prior to coating have a better performance after washing. The improvement is more pronounced in spray testing, where the water repellency is tested. The difference in the level of oil repellency becomes visible after 10 washing cycles, as can be seen in FIG. 12. After 20 washing cycles the pre-treated fabric still has oil repellency level 3.

Abrasion Durability

Three different polyester woven fabrics coated with a low power plasma coating according to Example 2 have undergone an Martindale abrasion test. Because afterwards a spray test was performed, larger samples than normal were needed, and the set-up was slightly changed.

A standard wool fabric was pressed with a force of 9 kPa onto a larger coated PES woven fabric. 5000 abrasion cycles have been done and the oil repellency was measured according to ISO 14419 and a spray test was performed according to ISO 9073—part 17 and ISO 4920. Then 5000 more abrasion cycles have been done and the oil repellency test and spray test have been repeated.

Figure 14:
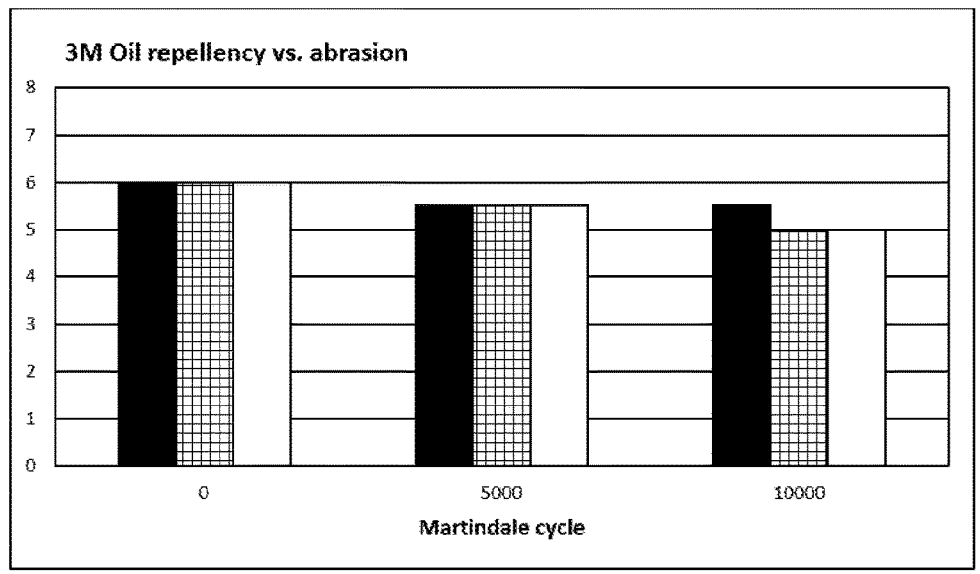
FIG. 14 shows the oil repellency in function of the number of Martindale abrasion cycles.
Figure 15:
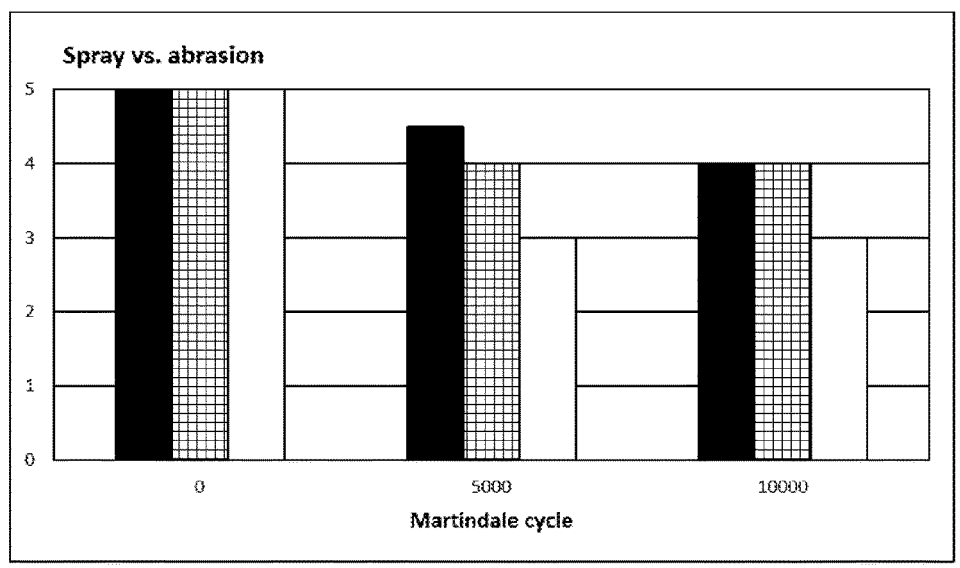
FIG. 15 shows the spray 5 test results in function of the number of Martindale abrasion cycles.

The graph of FIG. 14 shows the oil repellency in function of the number of Martindale abrasion cycles and the graph of FIG. 15 shows the spray test results in function of the number of Martindale abrasion cycles.

The invention claimed is:

1. A plasma chamber for coating a sheet of fabric, such as a textile material, with a polymer layer, the plasma chamber having
    a plurality of electrode layers each having a generally planar or plate like form arranged successively and substantially parallel to each other, within the plasma chamber,
    wherein both electrode layers of at least one pair of adjacent electrode layers of the plurality of electrode layers are either radiofrequency electrode layers or ground electrode layers,
    wherein one electrode layer of said pair of immediately adjacent electrode layers is disposed in use on one side of the sheet of fabric and another electrode layer of said pair of immediately adjacent electrode layers is disposed on an obverse side of the sheet of fabric,
    wherein the remaining electrode layers are arranged on either side of a passage for receiving the sheet of fabric, and
    wherein the plasma chamber further includes a plurality of rollers for guiding the sheet of fabric, in use, between said electrode layers thereby having coatings on both sides of the sheet of fabric.

2. A plasma chamber according to claim 1 having at least one pair of electrode sets, the electrode sets comprising at least three electrode layers and wherein the outer pair of electrode layers are either ground electrode layers or radiofrequency electrode layers.

3. A plasma chamber according to claim 2, wherein one or both of the first and second electrode sets has an inner electrode layer and a pair of outer electrode layers and either the inner electrode layer is a radiofrequency electrode and the outer electrode layers are ground electrodes, or the inner electrode layer is a ground electrode and the outer electrode layers are radiofrequency electrodes.

4. A plasma chamber according to claim 1, wherein the radiofrequency electrode layer or layers includes heat regulating means.

5. A plasma chamber according to claim 1, further including one or more compartments, the one or each compartment adapted to receive one or more rolls of fabric.

6. A plasma chamber according to claim 5 in which the rolls can be unwound or wound at between 1 m/min and 5 m/min.

7. A plasma chamber according to claim 1, in which the rollers are arranged to operate to move the fabric to be unwound or wound at a speed of between 0.1 m/min and 20 m/min.

8. A plasma chamber according to claim 1, wherein the rollers are operable to be driven independently of each other and fine-tuneable independently of each other.

9. A plasma chamber according to claim 1, wherein the rollers are configured for being cooled or heated to contribute to a more substantially uniform temperature in the plasma chamber thereby avoiding condensation of the monomer inside the plasma chamber.

10. A plasma chamber according to claim 9, wherein the cooling or heating is provided by means of liquid e.g. water or oil.

11. A plasma chamber according to claim 10, wherein the rollers may be heated from 20° C. to 85° C.

12. A plasma chamber according to claim 1, having one or more load cells which can be calibrated once a predetermined low base pressure is reached and prior to the first processing step.

13. A plasma chamber according to claim 12, wherein for each individual coating run the load cells are calibrated once the base pressure is reached and prior to the first processing step, e.g. prior to outgassing, or prior to the gas inlet and prior to turning on the electromagnetic field for a pretreatment, or prior to the gas inlet and prior to turning on the electromagnetic field for the coating step, whichever comes first.

14. A plasma chamber according to claim 12, wherein, in use, tension at which the fabric is wound is between 0.2 to 250 kg (2 to 2500 N).

15. A method for coating a sheet of fabric, such as a textile material, with a polymer layer, the method including the steps of
    providing a plasma chamber having a plurality of rollers for guiding the sheet of fabric and a plurality of electrode layers each having a generally planar or plate-like form arranged successively and substantially parallel to each other, within the plasma chamber,
    wherein both electrode layers of at least one pair of adjacent electrode layers of the plurality of electrode layers are either radiofrequency electrode layers or ground electrode layers,
    further wherein the remaining electrode layers are arranged on either side of the passage for receiving the sheet of fabric; and
    guiding the sheet of fabric between said electrode layers involving use of said plurality of rollers,
    wherein one electrode layer of said pair of immediately adjacent electrode layers is disposed on one side of the sheet of fabric and the other electrode layer of said pair is disposed on an obverse side of the sheet of fabric, thereby having coatings on both sides of the sheet of fabric.

* * * * *